(12) United States Patent
Manning

(10) Patent No.: US 6,853,590 B2
(45) Date of Patent: *Feb. 8, 2005

(54) METHODS AND APPARATUS FOR READING MEMORY DEVICE REGISTER DATA

(75) Inventor: Troy A. Manning, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 25 days.

This patent is subject to a terminal disclaimer.

(21) Appl. No.: 10/691,068

(22) Filed: Oct. 21, 2003

(65) Prior Publication Data

US 2004/0120190 A1 Jun. 24, 2004

Related U.S. Application Data

(60) Continuation of application No. 10/283,657, filed on Oct. 29, 2002, now Pat. No. 6,654,293, which is a continuation of application No. 09/938,809, filed on Aug. 24, 2001, now Pat. No. 6,496,420, which is a division of application No. 09/571,028, filed on May 15, 2000, now Pat. No. 6,363,018, which is a division of application No. 09/259,225, filed on Mar. 1, 1999, now Pat. No. 6,064,600.

(51) Int. Cl.$^7$ ............................................. G11C 7/00
(52) U.S. Cl. ........................... 365/189.05; 365/189.12; 365/230.08
(58) Field of Search ..................... 365/189.05, 189.12, 365/230.08, 233

(56) References Cited

U.S. PATENT DOCUMENTS

| | | | |
|---|---|---|---|
| 4,471,465 A | 9/1984 | Mayer et al. ............... | 364/900 |
| 4,969,126 A | 11/1990 | Maeno ........................ | 365/240 |
| 5,036,493 A | 7/1991 | Nielsen ................. | 365/230.03 |
| 5,327,393 A | 7/1994 | Koyanagi ................... | 365/233 |
| 5,402,389 A | 3/1995 | Flannagan et al. .......... | 365/233 |
| 5,548,794 A | 8/1996 | Yishay et al. ............... | 395/871 |
| 5,579,277 A | 11/1996 | Kelly .................... | 365/230.02 |
| 5,644,529 A | 7/1997 | Pascucci et al. ....... | 365/185.05 |
| 5,734,927 A | 3/1998 | Boutaud et al. ............ | 395/880 |
| 5,787,489 A | 7/1998 | Pawlowski .................. | 711/169 |
| 5,829,026 A | 10/1998 | Leung et al. ............... | 711/122 |
| 5,886,929 A * | 3/1999 | Becker et al. ......... | 365/189.05 |
| 6,385,709 B2 | 5/2002 | Merritt ....................... | 711/167 |

* cited by examiner

Primary Examiner—Huan Hoang
(74) Attorney, Agent, or Firm—Dorsey & Whitney LLP

(57) ABSTRACT

A methods and apparatus for reading register data from a memory device and outputting the register data to external data terminals of the memory device that outputs a first set of data bits from a memory array to the external terminals responsive to a first addressing signal. A register stores data, and outputs a second set of data bits responsive to a second addressing signal. A coupling circuit receives the second set of data bits, processes the data bits, and outputs a third set of data bits corresponding to the second set of data bits responsive to an enabling signal. A data path circuit that is coupled to the memory array to receive the first set of data bits is coupled to the coupling circuit to receive the third plurality of data bits, and to the external terminals. The data path circuit transmits the data bits received to the external terminals of the memory device.

30 Claims, 7 Drawing Sheets

US 6,853,590 B2

METHODS AND APPARATUS FOR READING MEMORY DEVICE REGISTER DATA

CROSS-REFERENCE TO RELATED APPLICATIONS

This application is a continuation of U.S. patent application Ser. No. 10/283,657, filed Oct. 29, 2002, now U.S. Pat. No. 6,654,293 which is a continuation of U.S. patent application Ser. No. 09/938,809, filed Aug. 24, 2001, issued Dec. 17, 2002 as U.S. Pat. No. 6,496,420, which is a divisional of U.S. patent application Ser. No. 09/571,028, filed May 15, 2000, issued Mar. 26, 2002 as U.S. Pat. No. 6,363,018, which is a divisional of U.S. patent application Ser. No. 09/259,225, filed Mar. 1, 1999, issued May 16, 2000 as U.S. Pat. No. 6,064,600.

TECHNICAL FIELD

This invention relates generally to memory devices used in computer systems, and more particularly, to methods and apparatus for reading register data from registers within the memory device.

BACKGROUND OF THE INVENTION

Conventional computer systems include a processor (not shown) coupled to a variety of memory devices, including read-only memories ("ROMs") which traditionally store instructions for the processor, and a system memory to which the processor may write data and from which the processor may read data. The processor may also communicate with an external cache memory, which is generally a static random access memory ("SRAM"). The processor also communicates with input devices, output devices, and data storage devices.

Processors generally operate at a relatively high speed. Processors such as the Pentium® and Pentium II® microprocessors are currently available that operate at clock speeds of at least 400 MHz. However, the remaining components of existing computer systems, with the exception of SRAM cache memory, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, bus bridge or similar device, and the input devices, output devices, and data storage devices are coupled to the processor bus through a bus bridge. The memory controller allows the system memory devices to operate at a clock frequency that is substantially lower than the clock frequency of the processor. Similarly, the bus bridge allows the input devices, output devices, and data storage devices to operate at a frequency that is substantially lower than the clock frequency of the processor. Currently, for example, a processor having a 300 MHz clock frequency may be mounted on a mother board having a 66 MHz clock frequency for controlling the system memory devices and other components.

Access to system memory is a frequent operation for the processor. The time required for the processor, operating, for example, at 300 MHz, to read data from or write data to a system memory device operating at, for example, 66 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs, which did not require that an address be provided to the DRAM for each memory access. More recently, synchronous dynamic random access memories ("SDRAMs") have been developed to allow the pipelined transfer of data at the clock speed of the motherboard. However, even SDRAMs are typically incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a packetized memory device known as a SLDRAM memory device. In the SLDRAM architecture, the system memory may be coupled to the processor, either directly through the processor bus or through a memory controller. Rather than requiring that separate address and control signals be provided to the system memory, SLDRAM memory devices receive command packets that include both control and address information. The SLDRAM memory device then outputs or receives data on a data bus that may be coupled directly to the data bus portion of the processor bus.

An example of a computer system 10 using the SLDRAM architecture is shown in FIG. 1. The computer system 10 includes a processor 12 having a processor bus 14 coupled to three SLDRAM packetized dynamic random access memory devices 16a–c through a memory controller 18. The computer system 10 also includes one or more input devices 20, such as a keypad or a mouse, coupled to the processor 12 through the processor bus 14, a bus bridge 22, and an expansion bus 24, such as an Industry Standard Architecture ("ISA") bus or a Peripheral Component Interconnect ("PCI") bus. The input devices 20 allow an operator or an electronic device to input data to the computer system 10. One or more output devices 30 are coupled to the processor 12 to display or otherwise output data generated by the processor 12. The output devices 30 are coupled to the processor 12 through the expansion bus 24, bus bridge 22 and processor bus 14. Examples of output devices 24 include printers and a video display units. One or more data storage devices 38 are coupled to the processor 12 through the processor bus 14, bus bridge 22, and expansion bus 24 to store data in or retrieve data from storage media (not shown). Examples of storage devices 38 and storage media include fixed disk drives floppy disk drives, tape cassettes and compact-disk read-only memory drives.

In operation, the processor 12 sends a data transfer command via the processor bus 14 to the memory controller 18, which, in turn, communicates with the memory devices 16a–c via the system memory bus 23 by sending the memory devices 16a–c command packets that contain both control and address information. Data is coupled between the memory controller 18 and the memory devices 16a–c through a data bus portion of the system memory bus 23. During a read operation, data is transferred from the SLDRAMs 16a–c over the memory bus 23 to the memory controller 18 which, in turn, transfers the data over the processor 14 to the processor 12. The processor 12 transfers write data over the processor bus 14 to the memory controller 18 which, in turn, transfers the write data over the system memory bus 23 to the SLDRAMs 16a–c. Although all the memory devices 16a–c are coupled to the same conductors of the system memory bus 23, only one memory device 16a–c at a time reads or writes data, thus avoiding bus contention on the memory bus 23. Bus contention is avoided by each of the memory devices 16a–c on the system memory 22 having a unique identifier, and the command packet contains an identifying code that selects only one of these components.

The computer system 10 also includes a number of other components and signal lines that have been omitted from FIG. 1 in the interests of brevity. For example, as explained below, the memory devices 16a–c also receive a command clock signal to provide internal timing signals, a data clock signal clocking data into the memory device 16, and a FLAG signal signifying the start of a command packet.

A typical command packet CA<0:39> for a SLDRAM packetized DRAM is shown in FIG. 2 and is formed by four packet words CA<0:9>, each of which contains 10 command bits. As will be explained in more detail below, each packet word CA<0:9> is applied on a command-address bus CA that includes ten lines CA0–CA9. In FIG. 2, the four packet words CA<0:9> comprising a command packet CA<0:39> are designated $PW_1$–$PW_4$. The first packet word $PW_1$ contains 7 bits identifying the packetized DRAM 16a–c that is the intended recipient of the command packet. Each of the packetized DRAMs is provided with a unique ID code that is compared to the 7 ID bits in the first packet word $PW_1$. Thus, although all of the packetized DRAMs 16a–c will receive the command packet, only the packetized DRAM 16a–c having an ID code that matches the 7 ID bits of the first packet word $PW_1$ will respond to the command packet.

The remaining 3 bits of the first packet word $PW_1$ as well as 3 bits of the second packet word $PW_2$ comprise a 6 bit command. Typical commands are read and write in a variety of modes, such as accesses to pages or banks of memory cells. The remaining 7 bits of the second packet word $PW_2$ and portions of the third and fourth packet words $PW_3$ and $PW_4$ comprise a 20 bit address specifying a bank, row and column address for a memory transfer or the start of a multiple bit memory transfer. In one embodiment, the 20-bit address is divided into 3 bits of bank address, 10 bits of row address, and 7 bits of column address.

Although the command packet shown in FIG. 2 is composed of 4 packet words each containing up to 10 bits, it will be understood that a command packet may contain a lesser or greater number of packet words, and each packet word may contain a lesser or greater number of bits.

One of the memory devices 16a is shown in block diagram form in FIG. 3. Each of the memory devices 16a–c includes a clock generator circuit 40 that receives a command clock signal CMDCLK and generates an internal clock signal ICLK and a large number of other clock and timing signals to control the timing of various operations in the memory device 16. The memory device 16a also includes a command buffer 46 and an address capture circuit 48, which receive the internal clock signal ICLK, a command packet CA<0:9> on a 10-bit command-address bus 50, and a FLAG signal on line 52. A memory controller (not shown) or other device normally transmits the command packet CA<0:9> to the memory device 16a in synchronism with the command clock signal CMDCLK. As explained above, the command packet CA<0:39>, which generally includes four 10-bit packet words, contains control and address information for each memory transfer. The FLAG signal identifies the start of a command packet, and it also signals the start of an initialization sequence. The command buffer 46 receives the command packet from the command-address bus 50, and compares at least a portion of the command packet to identifying data from an ID register 56 to determine if the command packet is directed to the memory device 16a or some other memory device 16b, 16c. If the command buffer 46 determines that the command packet is directed to the memory device 16a, it then provides the command words to a command decoder and sequencer 60. The command decoder and sequencer 60 generates a large number of internal control signals to control the operation of the memory device 16a during a memory transfer.

The address capture circuit 48 also receives the command packet from the command-address bus 50 and outputs a 20-bit address corresponding to the address information in the command packet. The address is provided to an address sequencer 64, which generates a corresponding 3-bit bank address on bus 66, a 10-bit row address on bus 68, and a 7-bit column address on bus 70. The column address and row address are processed by column and row address paths 73, 75 as will be described in more detail below.

One of the problems of conventional DRAMs is their relatively low speed resulting from the time required to precharge and equilibrate circuitry in the DRAM array. The packetized DRAM 16a shown in FIG. 3 largely avoids this problem by using a plurality of memory banks 80, in this case eight memory banks 80a–h. After a read from one bank 80a, the bank 80a can be precharged while the remaining banks 80b–h are being accessed. Each of the memory banks 80a–h receives a row address from a respective row latch/decoder/driver 82a–h. All of the row latch/decoder/drivers 82a–h receive the same row address from a predecoder 84 which, in turn, receives a row address from either a row address register 86 or a refresh counter 88 as determined by a multiplexer 90. However, only one of the row latch/decoder/drivers 82a–h is active at any one time, as determined by bank control logic 94 as a function of a bank address from a bank address register 96.

The column address on bus 70 is applied to a column latch/decoder 100, which supplies I/O gating signals to an I/O gating circuit 102. The I/O gating circuit 102 interfaces with columns of the memory banks 80a–h through sense amplifiers 104. Data is coupled to or from the memory banks 80a–h through the sense amplifiers 104 and the I/O gating circuit 102 and a data path subsystem 108, which includes a read data path 110 and a write data path 112. The read data path 110 includes a read latch 120 that stores data from the I/O gating circuit 102.

In the memory device 16a shown in FIG. 3, 64 bits of data are stored in the read latch 120. The read latch then provides four 16-bit data words to an output multiplexer 122 that sequentially supplies each of the 16-bit data words to a read FIFO buffer 124. Successive 16-bit data words are clocked into the read FIFO buffer 124 by a clock signal DCLK generated by the clock generator 40. The 16-bit words are then clocked out of the read FIFO buffer 124 by a clock signal RCLK obtained by coupling the DCLK signal through a programmable delay circuit 126. The read FIFO buffer 124 sequentially applies the 16-bit words to a driver circuit 128 in synchronism with the RCLK signal. The driver circuit, in turn, applies the 16-bit data words to a data bus 130. The driver circuit 128 also applies the data clock signal DCLK to a clock line 132. The programmable delay circuit 126 is programmed during initialization of the memory device so that the DCLK signal has the optimum phase relative to DCLK signal for the DCLK signal to clock the read data into the memory controller (not shown), processor, or other device.

The write data path 112 includes a receiver buffer 140 coupled to the data bus 130. The receiver buffer 140 sequentially applies 16-bit words from the data bus 130 to four input registers 142, each of which is selectively enabled by a signal from a clock generator circuit 144. The clock generator circuit generates these enable signals responsive to the data clock DCLK, which, for write operations, is applied to the memory device 16a on line 132 from the memory controller, processor, or other device. As with the command clock signal CMDCLK and command packet CA<0:9>, the memory controller or other device (not shown) normally transmits the data to the memory device 16a in synchronism with the data clock signal DCLK. The clock generator 144 is programmed during initialization to adjust the timing of the clock signal applied to the input registers 142 relative to the DCLK signal so that the input registers can capture the write data at the proper times. Thus, the input registers 142 sequentially store four 16-bit data words and combine them into one 64-bit data word applied to a write FIFO buffer 148. The data are clocked into the write FIFO buffer 148 by a clock signal from the clock generator 144, and the data are clocked out of the write FIFO buffer 148 by an internal write clock WCLK signal. The WCLK signal is generated by the clock generator 40. The 64-bit write data are applied to a write latch and driver 150. The write latch and driver 150 applies the 64-bit write data to one of the memory banks 80a–h through the I/O gating circuit 102 and the sense amplifiers 104.

As mentioned above, the memory device includes registers that store device parameters particular to the operation of that specific memory chip configuration. For example, the registers may store data indicative of the device configuration, data transfer format, speed capability, serial number, manufacturer, clock speed, etc. By way of further example, a register storing data indicative of the clock speed may be read to provide clock speed signals, MBPS400-800, that are used to time various signals as described in U.S. application Ser. No. 08/994,461, "Method and System for Processing Pipelined Memory Commands," to Manning, which is incorporated herein by reference.

These registers may be programmed with appropriate data, using relatively simple circuitry so that relatively little circuitry must be added to the memory device to write data to the registers. Also, registers can be programmed during manufacture or test, so that no additional circuitry may be required to program the registers. However, circuitry must be added to the memory device to read the data from the registers. The need to add this readout circuitry can be problematic because the large amount of circuitry already present in state of the art memory devices minimizes the space available on a semiconductor die to add this additional circuitry. The readout circuitry can easily be added by making the size of the die larger. Doing so, however, reduces the number of dies that can be manufactured from each wafer, thus increasing the cost of such memory devices. A need therefore exists to be able to read data from on-board registers in memory devices without using a great deal of read-out circuitry.

Although the foregoing discussion is directed to reading register data in packetized memory devices, such as SLDRAMs, similar problems exist in other types of memory devices.

SUMMARY OF THE INVENTION

The present invention provides methods and apparatus for reading register data from a memory device and outputting the register data to external data terminals of the memory device, primarily using addressing and data path circuitry in the memory device that is normally used to read data from the memory device. As a result, it is not necessary to add a great deal of read-out circuitry where the memory device outputs a first set of data bits from a memory array to the external terminals responsive to a first addressing signal. A register stores data, and outputs a second set of data bits responsive to an addressing signal. A coupling circuit receives the second set of data bits, processes the data bits, and outputs a third set of data bits corresponding to the second set of data bits responsive to an enabling signal. A data path circuit that is coupled to the memory array to receive the first set of data bits is coupled to the coupling circuit to receive the third plurality of data bits, and to the external terminals. The data path circuit transmits the data bits received to the external terminals of the memory device.

DETAILED DESCRIPTION OF THE INVENTION

Figure 1:
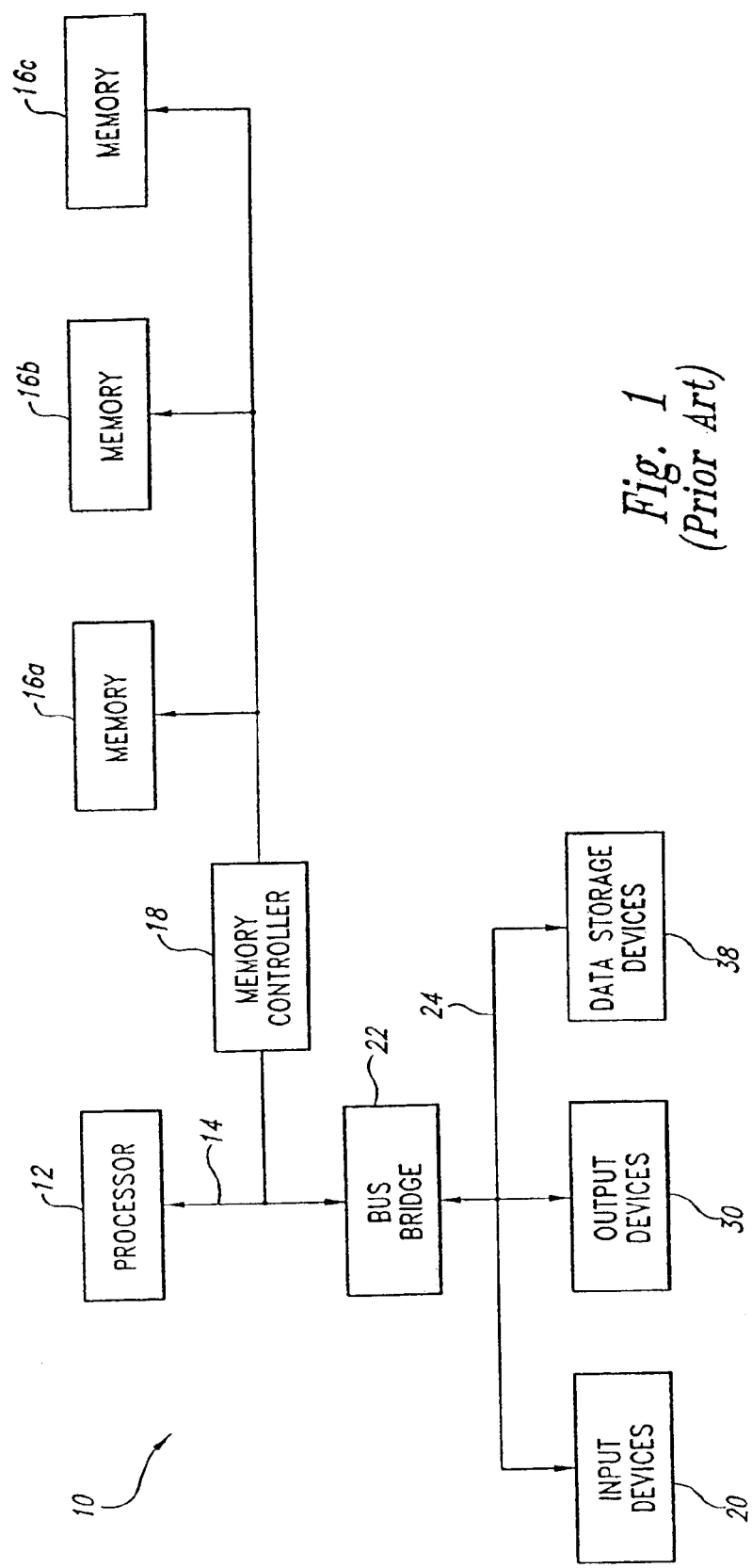
FIG. 1 is a block diagram of a conventional computer system using a plurality of SLDRAM memory devices.
Figure 3:
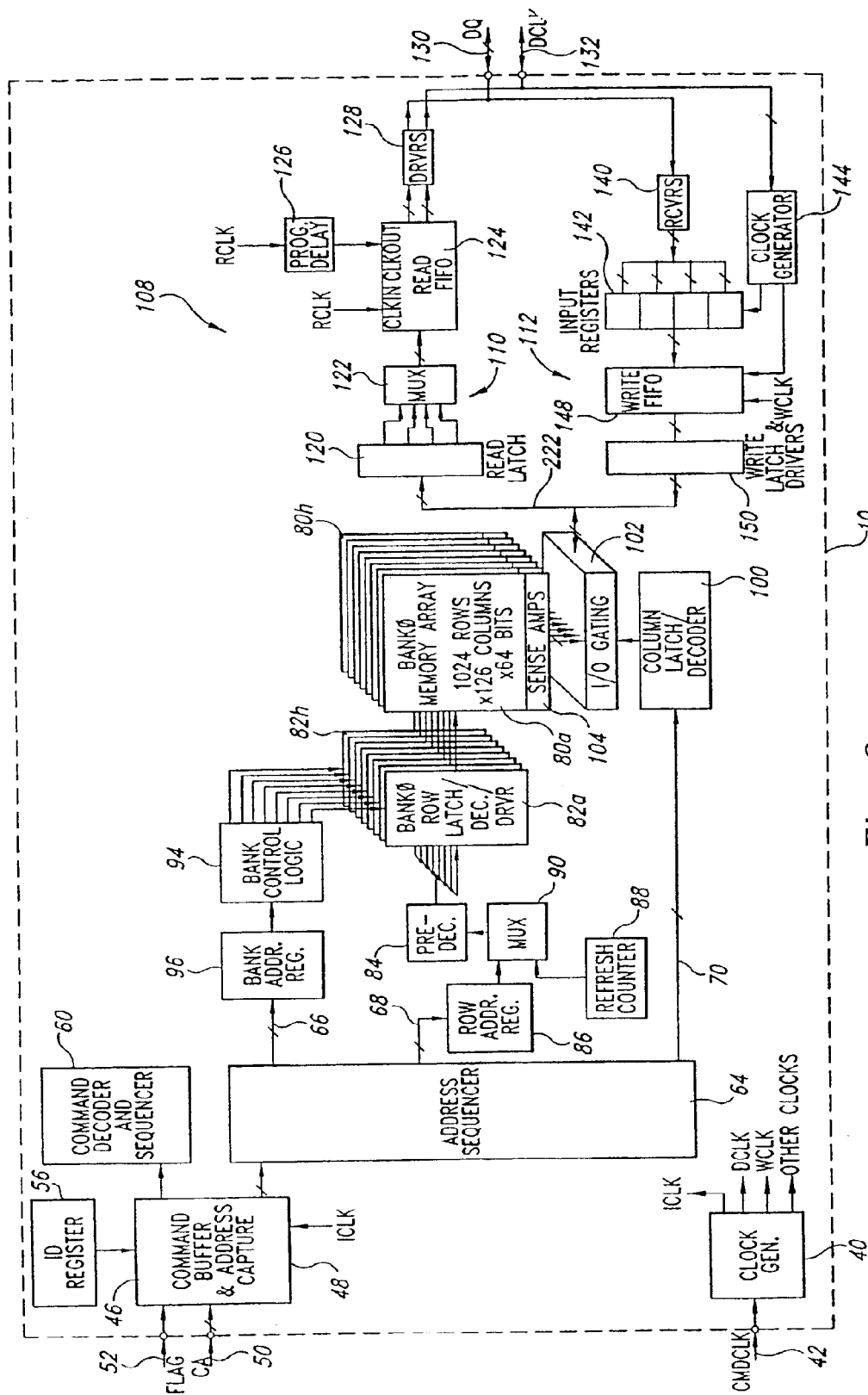
FIG. 3 is a block diagram of a conventional packetized DRAM used in the computer system of FIG. 1.
Figure 4:
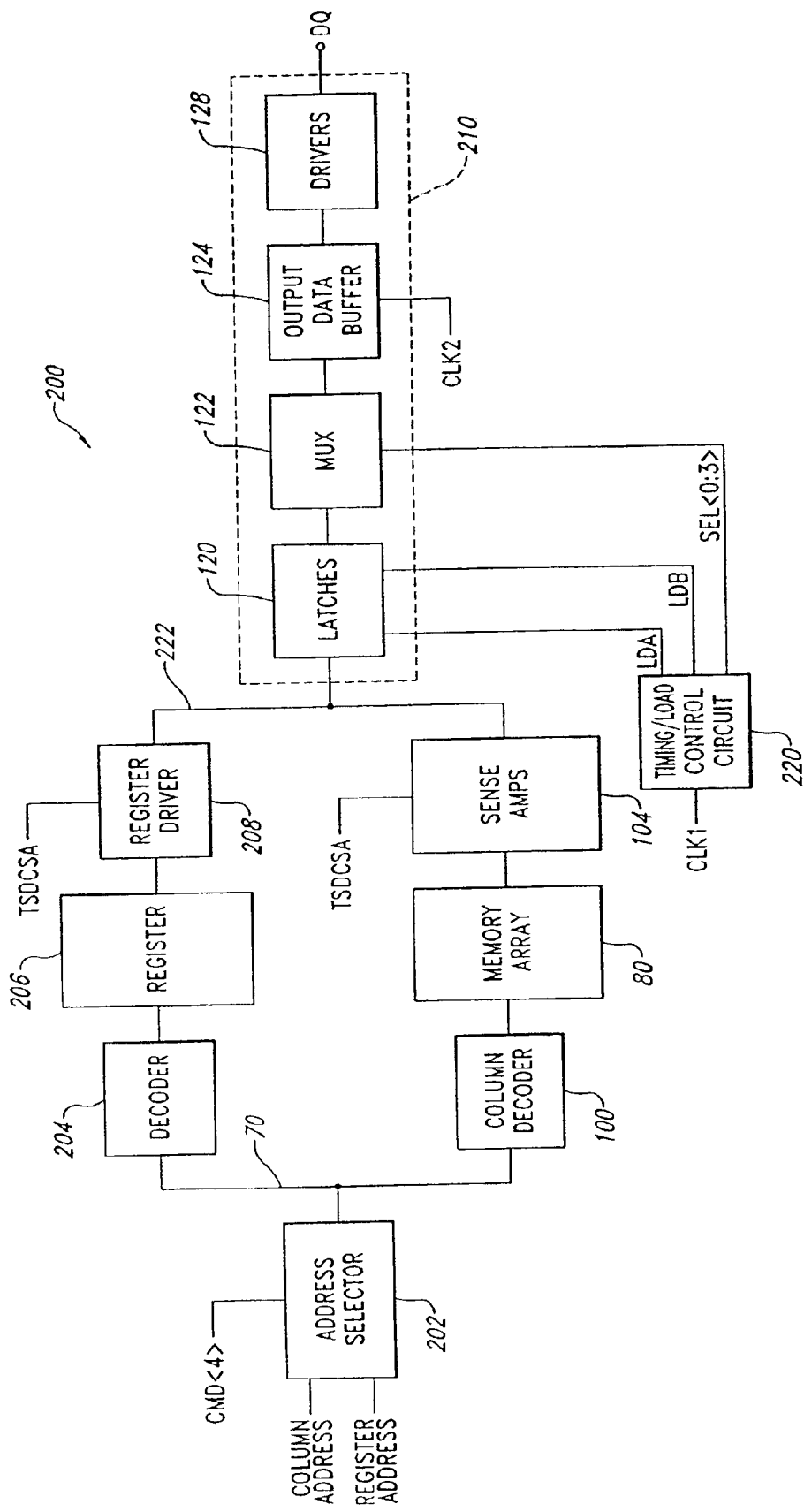
FIG. 4 is a functional block diagram of a register read system 200 according to one embodiment of the present invention.

FIG. 4 is a functional block diagram of a register read system 200 according to one embodiment of the present invention. The register read system 200 may be included in the memory device 16 in FIG. 3, and resulting memory device may be used in the computer system 10 shown in FIG. 1. With reference to Figure to 4, a memory controller 18 (not shown) applies command packets CA<0:39> containing a register address and FLAG bits to command buffer and address capture circuits 46, 48 via a command-address bus 50. The register address designates the location of stored data indicative of operating parameters, etc., stored in an on-board register.

Figure 2:
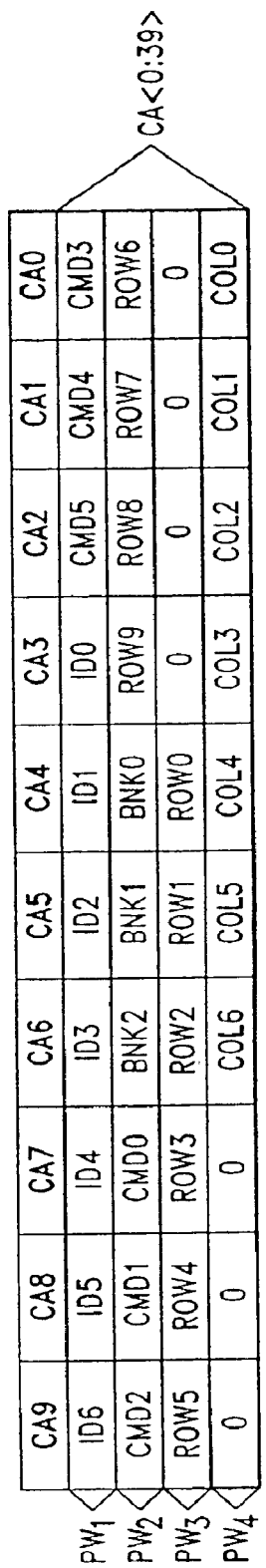
FIG. 2 is a diagram showing a typical command packet for a SLDRAM.

With reference to FIG. 2, the register address may be contained in the packet using the bits normally reserved for the row address, for example, or other bit locations as appropriate. A command code bit in the command packet CA<0:39>, such as CMD<4>, is set HIGH to indicate a register read. Referring back to FIG. 4, an address selector 202 within the command buffer and address capture circuits 46, 48 (FIG. 3) receives the register address and CMD<4> bits. In response to the CMD<4> bit being HIGH, the address selector 202 transmits the register address onto a column address bus 70. The command buffer and address capture circuits 46, 48 also output an enabling signal, such as a tri-state DC sense amplifier signal TSDCSA, described below, and a command LCMD<1:3> that prevents a write operation from occurring in the memory device 16 during a register read. The LCMD<1:3> signal is explained in greater detail in U.S. application Ser. No. 08/994,461, "Method and System for Processing Pipelined Memory Commands," to Manning, which is incorporated by reference, and will not be discussed further in the interest of brevity.

A decoder 204 receives the register address and selects a corresponding 32 bit register data set in a register 206. The register 206 outputs the register data set to a register driver 208. The register driver 208 also receives the tri-state DC sense amplifiers signal TSDCSA, which enables the register driver 208. When enabled, the register driver 208 reformats the 32 bit register data set to four 16 bit packets as described below, and outputs the reformatted register data set to an output data path 210. Other formatting is also possible. The output data path 210 serially couples the four 16 bit packets of the reformatted register data set to external data terminals DQ of the memory device 16. When disabled, the register driver 208 presents a tri-state condition to the output data path 210.

The output data path 210 includes the latch 120, multiplexer 122, output data buffer 124, and drivers 128 normally used in the memory device 10 of FIG. 3, although other components and configurations are also possible. These components 120–128 and their accompanying timing/load control circuit 220 may are described in detail in U.S. application Ser. No. 08/833,376, "Memory Device with Staggered Data Paths" to Manning which is herein incorporated by reference and is described only briefly below in the interest of brevity. Thus, the output data path 210 is the same data path used to output data bits stored in a memory array 80. Further, the operation of the data path 210 for a register read is the same as for a memory array read. Thus, most of the control signals that are generated for a memory array read can be used for a register read so that little additional control circuitry is required.

Although the register address is applied to the column address bus 70, which is coupled to the memory array 80, the memory array 80 is not activated. A column decoder 100 is coupled between the column address bus 70 and the memory array 80. The column decoder 100 receives the register address, and because the register address is not a recognized by the column decoder 100, the column decoder 100 does not activate a column within the memory array 80. Further, during a register read, the tri-state DC sense amplifier signal TSDCSA is applied to the sense amplifier 104 to place the sense amplifier 104 into a tri-state. This prevents the sense amplifier 104 from outputting data from the memory array 80 to the output data path 210, thereby preventing data contention with register data applied to the output data path 210. In addition, an input data path formed by the latches, drivers, and other circuitry 132–150 shown in FIG. 3 is deactivated when the CMD<4> bit is HIGH as described below during a register read.

Figure 5:
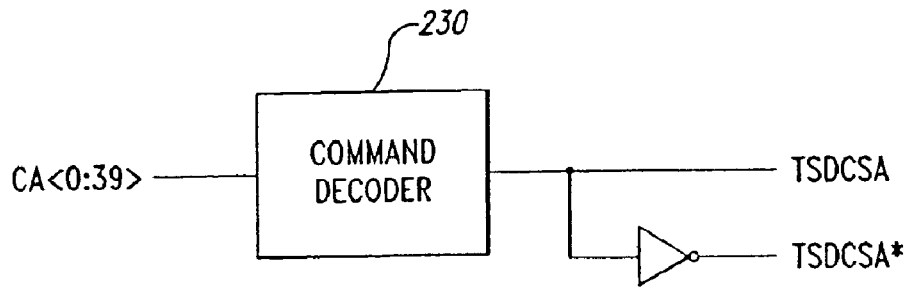
FIG. 5 is a functional block diagram of one embodiment of a command decoder.

FIG. 5 is a functional block diagram of one embodiment of a command decoder 230 that is typically part of the command buffer 46 (FIG. 3). The command decoder 230 receives the command packet CA<0:39> from the command-address bus 50. When the command bit CMD<4> of the command packet CA<0:39> is HIGH, indicating a register read, the command decoder 230 outputs a HIGH tri-state DC sense amplifier signal TSDCSA to the register driver 208 and the sense amplifier 104. The implementation of the command decoder 230 may be any of several appropriate methods known to those skilled in the art.

Figure 6:
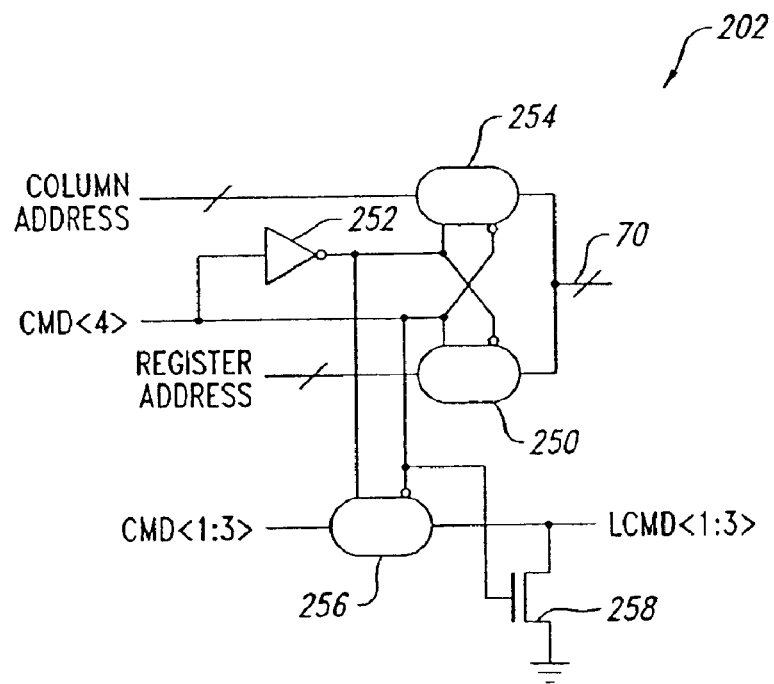
FIG. 6 is a logic diagram and schematic of one embodiment of an address selector.

FIG. 6 is a logic diagram and schematic of one embodiment of the address selector 202. Bits from the command packet CA<0:39> that contain the register address, such as the ROW0–9 bits contained in the second and third packet words $PW_2$, $PW_3$, are applied to the inputs of a set of first pass gates 250 (only one of which is shown in FIG. 6). As mentioned above, the register address bits may be transmitted in other locations and be either a greater or lesser number of bits within the command packet CA<0:39> as appropriate. The CMD<4> bit from the command packet CA<0:39> is also transmitted to the address selector 202. The CMD<4> bit is applied to an inverter 252, and the CMD<4> bit and its complement (from the inverter) are applied to complementary control inputs of the first pass gate 250 and a set of second pass gates 254 (again, only one of which is shown).

The first pass gate 250 receives the register address and transmits it onto the column address bus 70 only when the CMD<4> bit is HIGH, indicating a register read. The second pass gate 254 receives bits from the command packet CA<0:39> containing the column address and transmits them onto the column address bus 70 only when the CMD<4> bit is LOW. Thus, the register address is output to the column address bus 70 when a register read occurs, and the column address is output during normal operation when a register read is not occurring. Typically, either the column address or the register address is present within the command packet CA<0:39>, but not both.

A set of third pass gates 256 (only one of which is shown) receives three of the command bits CMD<1:3> from the command packet CA<0:39>, and receives the CMD<4> bit and its complement at complementary control terminals. The third pass gate 256 transmits the command bits CMD<1:3> to other parts of the command buffer 46 (not shown) when the CMD<4> bit is LOW, i.e. during normal operation, and does not transmit when the CMD<4> bit is HIGH, i.e., during a register read.

A set of transistors 258 (only one of which is shown in FIG. 6), or other switching device, is coupled between the output of the third pass gates 256 and a biasing voltage, such as ground. The CMD<4> bit is applied to the gate of the transistor 258, turning the transistor 258 ON during a register read, thereby biasing the command bits CMD<1:3> output from the third pass gate 256 to a logic "0." When grounded, the command bits CMD<1:3> disable the memory device 16 from receiving data bits on the input data path 132–150 (FIG. 3), i.e., prevent a write operation from occurring. The command bits CMD<1:3> also control other operations of the memory device 16 that are somewhat peripheral to the invention, and will not be discussed further in the interest of brevity.

Figure 7:
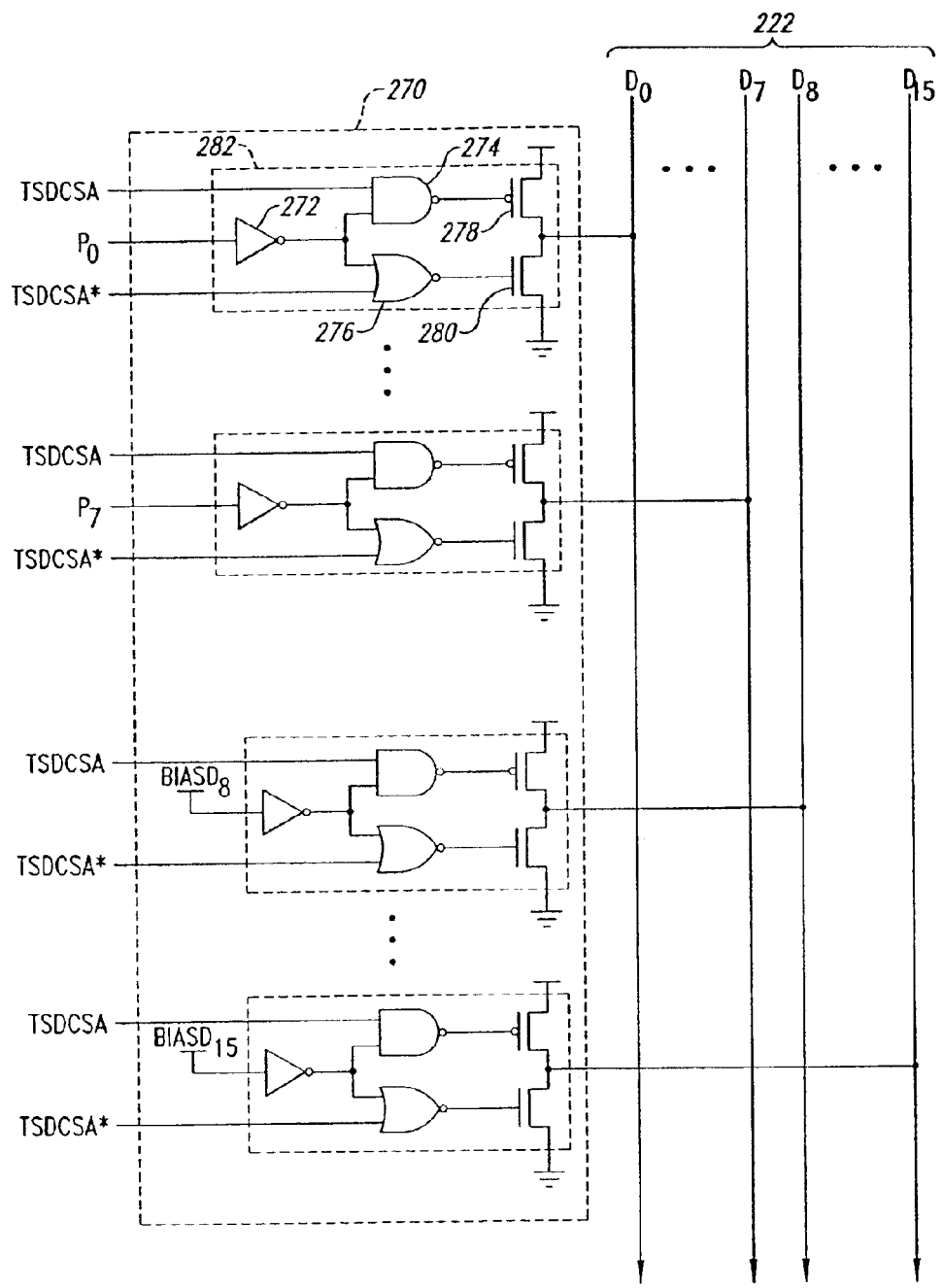
FIG. 7 is a logic diagram and schematic of one embodiment of a portion of a register driver.

FIG. 7 is a logic diagram and schematic of one embodiment of a portion of the register driver 208. The register driver 208 typically includes four coupling circuits 270, each of which includes sixteen conversion circuits 282, although either a greater or lesser number of coupling circuits 270 and conversion circuits 282 may be used as appropriate. Each of the coupling circuits 270, functions similarly, processing one fourth of the 32-bit register data set, and only one will be described in the interest of brevity.

The coupling circuit 270 receives the tri-state DC sense amplifier signal TSDCSA and eight data bits P0–7 of the 32-bit register data set from the register 206. Each data bit P0–7 is applied to a respective inverter 272 while the tri-state DC sense amplifier signal TSDCSA and its complement are applied to inputs of a respective NAND gate 274 and a NOR gate 276. When the TSDCSA signal and its compliment TSDCSA* are active high and low, respectively, the NAND gate 274 and the NOR gate 276 function as inverters. The NAND gate 274 and NOR gate 276 each also receive the output from the inverter 272. Thus, when the NAND gate 274 and the NOR gate 276 are enabled, the outputs of the NAND gate 274 and the NOR gate 276 will be LOW when the respective data bit P0–7 is LOW, and the outputs of the NAND gate 274 and the NOR gate 276 will be HIGH when the respective data bit P0–7 is HIGH. The output of the NAND gate 274 will be HIGH and the output of the NOR gate 276 will be LOW when the TSDCSA signal is inactive LOW.

The output from the NAND gate 274 is applied to a gate of a PMOS transistor 278 that has its source coupled to a voltage source, such as $V_{CC}$, and its drain coupled to a drain of an NMOS transistor 280. The NMOS transistor 280 has a source coupled to another voltage source, such as ground, and a gate that receives the output from the NOR gate 276. The drains of the transistors 278, 280 are coupled to one line of a 64-bit bus 222.

In the operation of the coupling circuit 270, a data bit corresponding to the complement of the respective register bit P0–7 is output to a respective line D0–7 of the bus 222 when the tri-state DC sense amplifier signal TSDCSA is HIGH, i.e., when a register read occurs. When the tri-state DC sense amplifier signal TSDCSA is LOW, i.e., a register read is not occurring, both transistors 278, 280 are OFF, tri-stating the output of a conversion circuit 282. This is shown in Table 1, with a "*" representing the complement of the signal.

TABLE 1

| Output of the Conversion Circuit 282 | |
| --- | --- |
| TSDCSA | OUTPUT |
| low | tri-state |
| high | input* |

The conversion circuit 282 is repeated seven more times in the coupling circuit 270 to process the eight data bit portion P0–7 of the register data set output from the register 206. Because four coupling circuits 270 are used to process the 32-bit register data set, each coupling circuit 270 processes ¼ of the data set: 8 data bits.

The bus 222 is typically a 64-bit bus. Thus, while 32 bits are available from the register data set, 64 data bits must be transmitted on the bus 222. This is accomplished by each coupling circuit 270 accounting for 16 of the 64 bits even though each coupling circuit only receives 8 bits from the register 208.

Eight additional conversion circuits 282 are included in the coupling circuit 270. These conversion circuits 282 have their inputs to their respective inverters 272 coupled to a biasing voltage, such as $V_{CC}$. These additional eight conversion circuits 282 thus output a logic "0" when a register read occurs, i.e., when the tri-state DC sense amplifier signal TSDCSA is HIGH, and otherwise are tri-stated. A total of 16 data bits per coupling circuit 270 are thus transmitted on the respective lines D0–15 of the bus 222. When four coupling circuits 270 are used as described above, the 32-bit register data set is converted into 64 bits for transmission on the bus 222.

Thus, the four coupling circuits 270 in the register driver 208 respectively process bits P0–7, P8–15, P16–23, and P24–31 of the 32 bit register data set, and respectively output bits to lines D0–15, D16–31, D32–47, and D48–63 of the bus 222.

Those skilled in the art will recognize that other logic configurations, types of transistors, and voltages may be substituted for the conversion circuit 282 without deviating from the scope of the invention. Similarly, a greater or lesser number of the data bits from the register 206, coupling circuits 270, conversion circuits 282, and data lines D0–63 may be used as appropriate.

Figure 8:
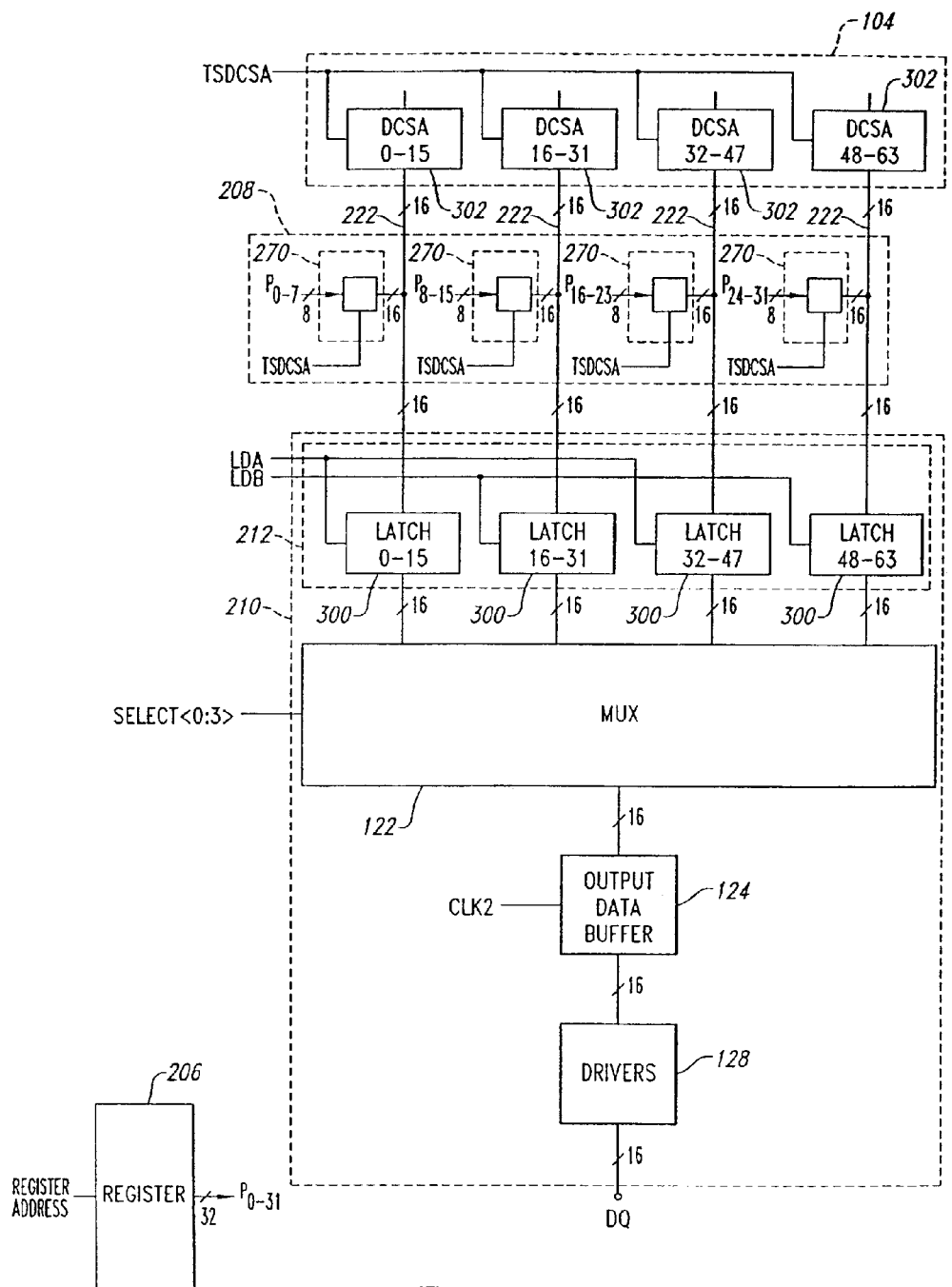
FIG. 8 is a functional block diagram showing one embodiment of the register read system of FIG. 4 in greater detail.

FIG. 8 is a functional block diagram showing one embodiment of the register read system 200 of FIG. 4 in greater detail. During a register read, the register 206 outputs the 32-bit register data set P0–31 to four coupling circuits 270, eight bits to each coupling circuit 270. Each coupling circuit 270 outputs 16 bits to the bus 222: eight data bits corresponding to the bits from the register 206, and eight "filler" bits generated by the coupling circuit 270. The combined 64 bits are loaded into the latches 212 that includes four 16-bit latch circuits 300.

Each latch circuit 300 loads the data bits from the respective coupling circuit 270 in synchronization with one of a pair of load signals LDA, LDB, with the first and third latch circuits 300 controlled by the first load command LDA, and the second and fourth latch circuits 300 controlled by the second load command LDB. The load signals LDA, LDB and a control signal SEL<0:3> are generated by the timing control circuit 220 responsive to a clock signal CLK1. The timing control circuit 220 is described in greater detail in U.S. application Ser. No. 08/833,376, "Memory Device with Staggered Data Paths" to Manning, filed on Apr. 4, 1997, incorporated by reference. The loaded data bits are then applied to the multiplexer 122 which selects the data bits from one of the latch circuits 300 responsive to a control signal SEL<0:3>. The 16-bit packets from the four coupling circuits 270 are sequentially output by the multiplexer 122 to the output data buffer 124.

The output data buffer 124 sequentially applies the 16-bit words to the driver circuit 128 in synchronism with a second clock signal CLK2. The driver circuit 128, in turn, applies the 16-bit data words to the external data terminals via the data bus 130.

As mentioned above, the operation of the output data path 210 is described in greater detail in U.S. application Ser. No. 08/833,376, "Memory Device with Staggered Data Paths" to Manning, which was incorporated by reference.

The sense amplifier 104 includes four DC sense amplifiers 302 that are also coupled to the bus 222. As mentioned above, the tri-state DC sense amplifier signal TSDCSA goes HIGH when register read occurs, thereby placing each of the DC sense amplifiers 302 into a tri-state. This prevents the DC sense amplifiers 302 from applying data bits from the memory array 80 to the bus 222 during a register read.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of operating a memory device, the memory device having addressing and data path circuitry for reading data and providing the same to external terminals of the memory device, the method comprising:

providing a memory command and a memory address to the memory device;

in response to a first memory command, providing memory data from a memory location in a memory array corresponding to the memory address to the external terminals of the memory device via a data path; and in response to a second memory command, reading parameter data stored in a first format from a parameter memory corresponding to the memory address, processing the parameter data in the first format to generate parameter data in a second format, and decoupling the data path from the memory array and coupling the same to receive the parameter data in the second format and provide the parameter data to the external terminals of the memory device.

2. The method of claim 1 wherein processing the parameter data in the first format to generate parameter data in a second format comprises adding null bits to the parameter data until it has the same number of bits of the memory data.

3. The method of claim 2 wherein the number of bits of the memory data is 16-bits.

4. The method of claim 1 wherein reading parameter data stored in a first format comprises:

providing the memory address as a register address to a register address decoder; and reading parameter data from a location in a register corresponding to the register address.

5. The method of claim 4, further comprising:

generating a control signal in response to the second memory command;

activating a register driver coupled to the register and disabling sense amplifier circuits coupled to the memory array in response to the control signal.

6. The method of claim 1, wherein processing the parameter data in the first format to generate parameter data in a second format comprises converting the parameter data to the same format in which data from the memory data is transmitted.

7. The method of claim 1 wherein the parameter data comprises a plurality of data bits representing clock speed information of the memory device.

8. The method of claim 7, further comprising operating the memory device at a clock speed based on the clock speed information.

9. A method of operating a memory device, the memory device having addressing and data path circuitry for reading data and providing the same to external terminals of the memory device, the method comprising:

providing a memory command requested data and a memory address to the memory device;

in response to receiving the memory command having an inactive command bit, accessing a memory location in a memory array corresponding to the memory address and coupling a data path to the memory array to provide the memory data stored at the memory location to the external terminals; and in response to a memory command having an active command bit, accessing a parameter storage location corresponding to the memory address to read parameter data stored therein, reformatting the parameter data, and coupling the data path to the parameter storage location to provide the reformatted parameter data to the external terminals.

10. The method of claim 9 wherein reformatting the parameter data comprises converting the parameter data to the same format in which data from the memory data is provided.

11. The method of claim 10 wherein converting the parameter data comprises adding null bits to the parameter data until it has the same number of bits of the memory data.

12. The method of claim 11 wherein the number of bits of the memory data is 16-bits.

13. The method of claim 9 wherein accessing the parameter storage location comprises:

providing the memory address as a register address to a register address decoder; and reading parameter data from a location in a register corresponding to the register address.

14. The method of claim 13, further comprising:

generating a control signal in response to the memory command having the inactive command bit;

activating a register driver coupled to the register and disabling sense amplifier circuits coupled to the memory array in response to the control signal.

15. The method of claim 9 wherein the parameter data comprises a plurality of data bits representing clock speed information of the memory device.

16. The method of claim 15, further comprising operating the memory device at a clock speed based on the clock speed information.

17. A method for reading data from a memory device having external data terminals, the method comprising:

storing parameter data for the memory device in a parameter storage location, the parameter data having a first data format;

storing memory data in a memory array, the memory data having a second data format;

receiving a memory command having command signals and memory address signals;

decoding the command and memory address signals;

accessing the parameter data stored in the parameter storage location corresponding to memory address signals, reformatting the parameter data from the first data format to the second data format, and coupling the reformatted parameter data to the external data terminals in response to the command including an active parameter read signal; and accessing the memory data stored in the memory array corresponding to the memory address signals and coupling the memory data to the external data terminals in response to the command including an inactive parameter read signal.

18. The method of claim 17 wherein reformatting the parameter data from the first data format to the second data format comprises adding null bits to the parameter data until it has the same number of bits of the memory data.

19. The method of claim 18 wherein the number of bits of the memory data is 16-bits.

20. The method of claim 17 wherein accessing the parameter data stored in the parameter storage location comprises:

providing the memory address signals as a register address to a register address decoder; and reading the parameter data from a location in a register corresponding to the register address.

21. The method of claim 20, further comprising:

generating a control signal in response to the command including an active parameter read signal; and activating a register driver coupled to the register and disabling sense amplifier circuits coupled to the memory array in response to the control signal.

22. The method of claim 17 wherein storing the parameter data comprises storing a plurality of data bits representing clock speed information of the memory device.

23. The method of claim 22, further comprising operating the memory device at a clock speed based on the clock speed information.

24. A method of operating a memory device having command and address terminals, the method comprising:

receiving address signals at the address terminals;

receiving command signals at the command terminals;

decoding the command signals and determining whether a parameter read command has been requested;

in the event a parameter read command is received, accessing a parameter storage location corresponding to the address signals to retrieve parameter data, reformatting the parameter data to an output data format, and coupling the reformatted parameter data to a data path; and in the event a memory read command is not received, decoding the address signals, accessing a memory location in a memory array corresponding to the address signals to retrieve memory data and coupling the memory data to the data path if a parameter read command is not received to provide the memory data in the output data format.

25. The method of claim 24 wherein reformatting the parameter data to an output format comprises adding null bits to the parameter data until it has the same number of bits of the memory data.

26. The method of claim 25 wherein the number of bits of the memory data is 16-bits.

27. The method of claim 24 wherein accessing the parameter data storage location comprises:

providing the memory address signals as a register address to a register address decoder; and reading the parameter data from a location in a register corresponding to the register address.

28. The method of claim 27, further comprising:

generating a control signal in response to the command including an active parameter read signal; and activating a register driver coupled to the register and disabling sense amplifier circuits coupled to the memory array in response to the control signal.

29. The method of claim 24 wherein the parameter data comprises a plurality of data bits representing clock speed information of the memory device.

30. The method of claim 29, further comprising operating the memory device at a clock speed based on the clock speed information.

* * * * *